(12) United States Patent
Toyoda

(10) Patent No.: US 6,579,740 B2
(45) Date of Patent: Jun. 17, 2003

(54) METHOD OF MAKING A THIN FILM SENSOR

(75) Inventor: Inao Toyoda, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/960,360

(22) Filed: Sep. 24, 2001

(65) Prior Publication Data

US 2002/0043672 A1 Apr. 18, 2002

(30) Foreign Application Priority Data

Oct. 13, 2000 (JP) .................................... 2000-313547

(51) Int. Cl.$^7$ .................. H01L 21/00; H01L 27/14; H01L 21/302; G01F 1/68
(52) U.S. Cl. ............... 438/57; 438/57; 438/753; 438/713; 257/428; 73/204.6
(58) Field of Search ............ 438/57, 753, 713; 257/428; 73/204.26

(56) References Cited

U.S. PATENT DOCUMENTS

| | | | |
|---|---|---|---|
| 4,888,988 A | 12/1989 | Lee et al. | |
| 6,194,236 B1 * | 2/2001 | Sakai et al. | 438/17 |
| 6,259,099 B1 * | 7/2001 | Foulon et al. | 250/370.01 |
| 6,456,014 B1 * | 9/2002 | Ono et al. | 315/169.3 |

FOREIGN PATENT DOCUMENTS

| | | | | |
|---|---|---|---|---|
| DE | 4102285 A1 * | 8/1992 | ............. | G01T/1/24 |
| DE | 4218789 A1 * | 12/1993 | ............ | H01L/31/09 |
| JP | A-58-52882 | 3/1983 | | |
| JP | A-61-26828 | 2/1986 | | |
| JP | A-61-38427 | 2/1986 | | |
| JP | A-61-97539 | 5/1986 | | |
| JP | A-6-273208 | 9/1994 | | |

OTHER PUBLICATIONS

Wolf, Silicon processing for the vlsi era, vol. 1, pp. 539–542.*
Wolf et al., Silicon processing for VLSI Era, vol. 1, pp. 520–534.*
Lahiji and Wise, "A Batch–Fabricated Silicon Thermopile Infrared Detector," *IEEE Transactions of Electron Device*, vol. ED–29, No. 1, Jan. 1982.
Choi and Wise, "A Silicon–Termopile–Based Infrared Sensing Array for Use in Automated Manufacturing," *IEEE Transactions on Electron Devices*, vol. ED–33, No. 1, Jan. 1986.

* cited by examiner

*Primary Examiner*—Tom Thomas
*Assistant Examiner*—Samuel A. Gebremariam
(74) *Attorney, Agent, or Firm*—Posz & Bethards, PLC (57) ABSTRACT

In a thin-film infrared sensor, (100)-oriented semiconductor substrate is used for the sensor fabrication. A surface of the substrate is partially masked to provide an unmasked section where a concave is made and a masked section on the back side of an alley between thin-film sensing areas. An anisotropic etching using an etchant such as KOH is applied to the masked substrate to make the concave (the thin-film sensing areas) and to provide an unetched portion of the substrate at the bottom of the concave on the back side of the alley between the sensing areas. The unetched portion of the substrate makes a rim to support the sensing areas. High concentration Boron doping is not necessary. Thus, it is possible to reduce deformation of thin-film sensing areas caused by a stress in the rim and to reinforce the rim.

14 Claims, 7 Drawing Sheets

METHOD OF MAKING A THIN FILM SENSOR

CROSS REFERENCE TO RELATED APPLICATION

This application is based on and incorporates herein by reference Japanese Patent Application No. 2000-313547 filed on Oct. 13, 2000.

BACKGROUND OF THE INVENTION

The present invention relates to a semiconductor device that includes a concave made on a side of the semiconductor device and a plurality of thin-film sensing areas in a thin film area formed on the back side of a bottom of the concave and to a fabrication method of the device.

One of the related semiconductor devices is a thermopile infrared sensor that makes it possible to measure quickly a temperature of an object without contacting. This type of infrared sensor has a plurality of sensing areas in a thin film area to measure temperatures at a plurality of places on an object. In that case, a thin film area needed is so wide that the thin film area becomes weak enough to cause a damage of the thin film during a sensor fabrication or in use. Thickening to reinforce the thin film area is undesirable because the thin film area should suppress thermal conduction of the sensing areas.

An infrared sensor with a rim made from a Boron-doped-etch-stop layer under an alley between the sensing areas is proposed to support the thin film area. The layer however requires high concentration doping of an impurity, such as $10^{19}$ cm$^{-3}$ to $10^{20}$ cm$^{-3}$ or more. As a result, the thin-film sensing areas tend to deform due to a stress in the rim caused by the high concentration doping and the rim tends to be weakened because crystal defects in the rim are increased by the high concentration doping.

SUMMARY OF THE INVENTION

It is an object of this invention to reduce deformation of thin-film sensing areas caused by a stress in a rim made for supporting the thin-film sensing areas that are formed on a silicon substrate of a semiconductor device and to reinforce the rim.

According to the present invention, an anisotropic etching is applied to a semiconductor substrate to form a rim for supporting a thin film area. The rim is formed by leaving an unetched portion of the substrate by means of masking a section on the back side of an alley between the sensing areas or by creating an electrochemically etch-proof region under an alley between the sensing areas. As a result, high concentration Boron doping such as $10^{19}$ cm$^{-3}$ to $10^{20}$ cm$^{-3}$ or more is not required. Thus, it is possible to reduce deformation of thin-film sensing areas caused by a stress in a rim and to reinforce the rim.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described in detail with reference to various embodiments and modifications.

First Embodiment

Figure 1:
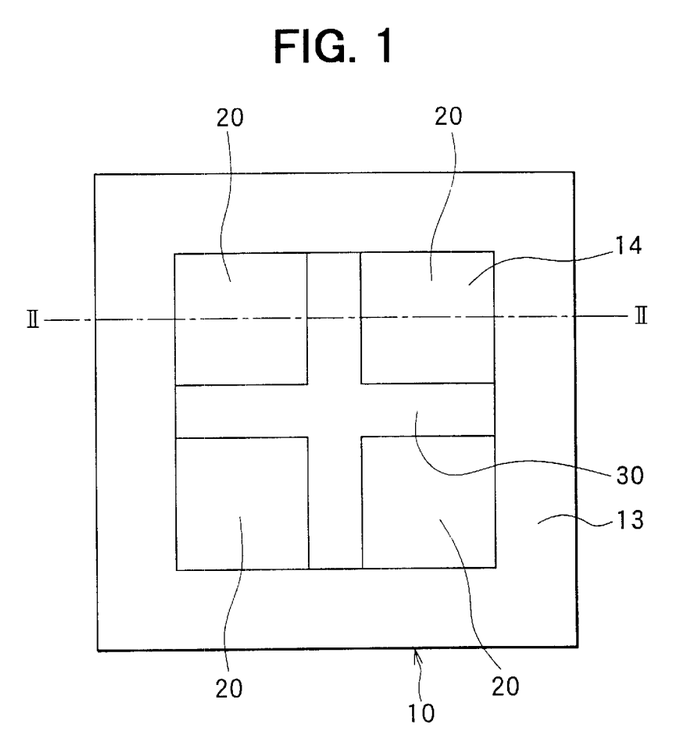
FIG. 1 is a plan view of an infrared sensor according to a first embodiment of the present invention.
Figure 2:
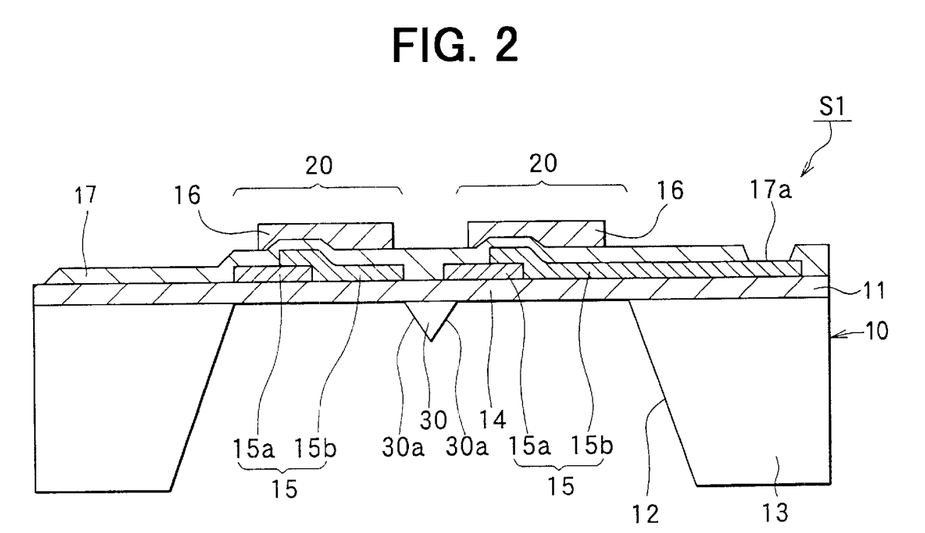
FIG. 2 is a cross-sectional view of the infrared sensor taken along line II—II in FIG. 1.

An infrared sensor according to a first embodiment is shown in FIGS. 1 and 2 indicated with a reference numeral S1. The infrared sensor S1 is for measuring quickly a temperature of an object without contacting and may be utilized for an air conditioner.

A (100)-oriented silicon substrate 10 is used as a substrate as shown in FIG. 2. Hereafter, the terms, the top side and the bottom side, mean one side that includes a thin-film sensing area 20 and the other side that includes a concave 12, respectively. The silicon substrate 10 includes a thin film 11 made of silicon nitride or silicon oxide (hereafter, silicon nitride as an example) on the top side and a concave 12 on the bottom side. A thin film area 14 that is much thinner than a periphery 13 is formed at the bottom of the concave 12. The thicknesses of the thin film area 14 and the periphery 13 are practically the same as those of the thin film 11 and the silicon substrate 10, respectively. A plurality of thin-film sensing areas 20 for sensing infrared are formed on the thin film area 14. A rim 30 made of the silicon substrate 10 to support the thin film area 14 and to isolate thermally each thin-film sensing area 20 is formed at the bottom of the concave 12 on the back side of an alley between the sensing areas 20. The rim 30 supporting thin film area 14 enables to thin the thickness of the sensing area 20 down to 1.5 μm to 2.0 μm. As shown in FIG. 1, a cross-shaped arrangement of the rim 30 is preferable to reinforce the thin-film area 14. The rim 30 is an unetched portion of the substrate 10 having a (111)-oriented side slope 30a and has a triangular shape in the perpendicular cross-section to a (100)-oriented surface. The impurity concentration of the rim 30 is 1×10$^{19}$ cm$^{-3}$ or less.

As shown in FIG. 1, the cross-shaped rim 30 and the periphery 13 partition the thin film area 14 into four fields. Each thin-film sensing area 20 is formed on each of the four partitioned field. Namely, four thin-film sensing areas 20 are formed on the thin film area 14 on the same level. Each thin-film sensing area 20 comprises a part of the thin film area 14, a thermocouple member 15 (a transducer in this invention) on the thin film area 14 and an infrared absorbing film 16 accumulated on the thermocouple member 15. The thermocouple member 15 transduces heat generated by an infrared exposure to the film 16 into an electric signal. The thermocouple member 15 is composed of two conductive or semi-conductive materials that have a different Seebeck coefficient from each other. In this embodiment, the thermocouple member 15 is formed by means of connecting tens of thermocouples consisting of an n-type polysilicon line 15a and an aluminum line 15b in series to form a thermopile. The thermocouple member 15 at each thin-film sensing area 20 is coated with a dielectric film 17 such as silicon nitride film. A wire-bonging place 17a is made by means of opening a part of the film 17 on the thermocouple 15 on the periphery 13.

The infrared absorbing film 16 is coated on the thermocouple member 15 with the dielectric film 17 in-between. The film 16 is made from a material that generates heat when the material absorbs infrared. The material may be gold black consisting of small particles of gold.

Figure 3A:
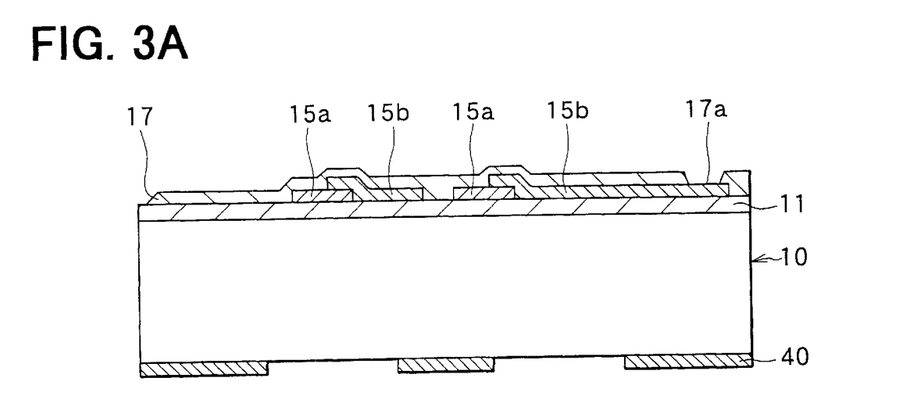
FIGS. 3A, 3B and 3C are cross-sectional views of a fabrication process of the first embodiment.
Figure 3B:
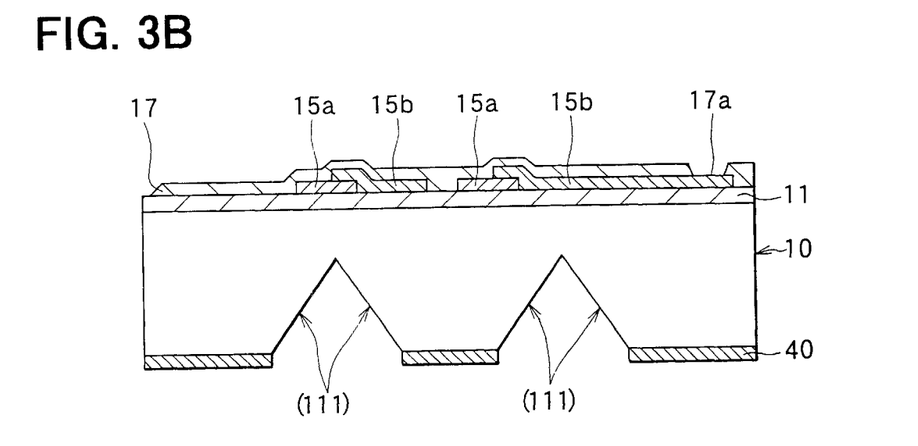
Figure 3C:
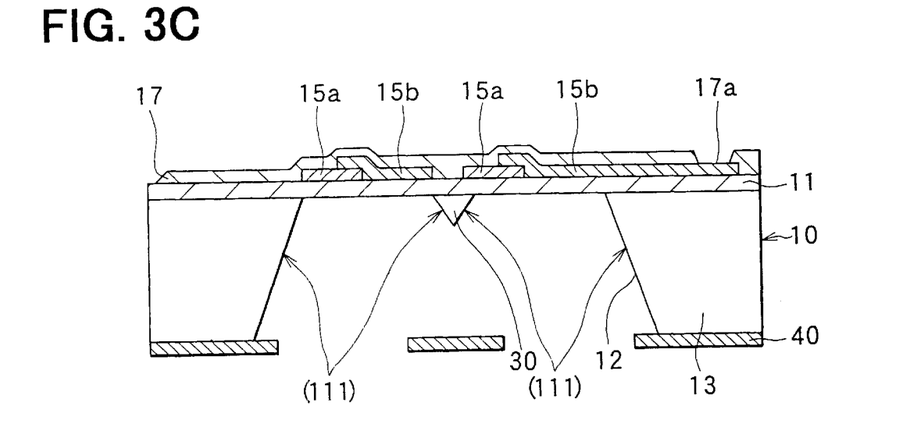
Figure 4:
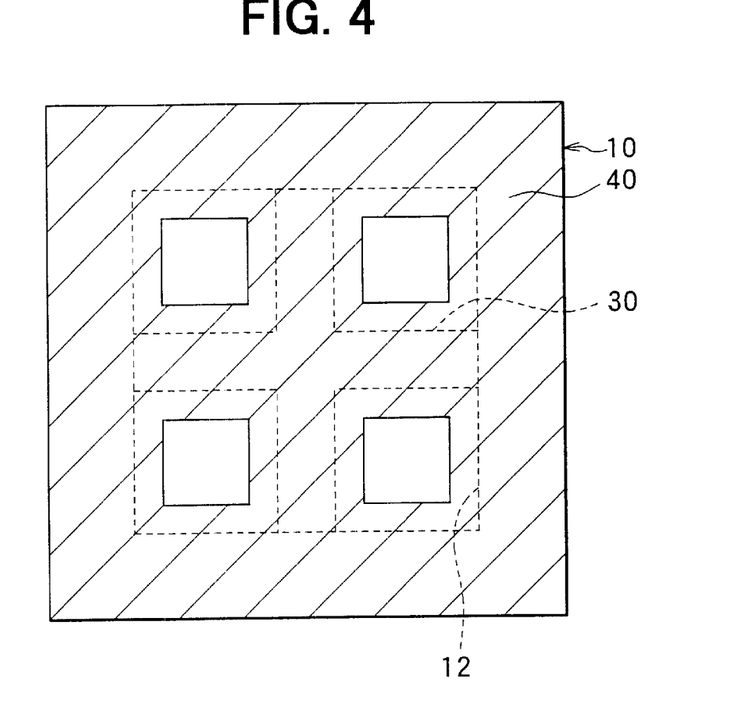
FIG. 4 is a plan view of a mask pattern of the first embodiment.

A fabrication method of the infrared sensor S1 is described as follows. As shown in FIG. 2, desired patterns of the thin film 11 made of silicon nitride, the n-type polysilicon line 15a, the aluminum line 15b and the dielectric film 17 are defined one by one on a side of a (100)-oriented silicon substrate. As shown in FIG. 3A and FIG. 4, a surface on the bottom side of the substrate is partially masked by a film 40 that is made of a material such as silicon nitride to provide both an unmasked section on the back side of the thin-film sensing area 20 and a masked section on the back side of the alley between the sensing areas 20. Namely, the rim 30 is formed under the masked section. The width of the masked section is wider than that of the rim 30 as shown in FIG. 3C and FIG. 4.

An anisotropic etching is applied to the partially masked surface on the bottom side of the semiconductor substrate 10. In the case that an anisotropic etchant such as KOH or TMAH (tetra-methyl-ammonium-hydroxide) is used, the etching rate of a (111)-oriented plane is so slower than that of a (100) plane that the etching proceeds with making a V-shaped groove having a (111)-oriented side slope as shown in FIG. 3B. The thin film 11 works as an etch stopper so that further etching provides both the concave 12 and the unetched portion of the substrate 10 having (111)-oriented side slopes 30a at the bottom of the concave 12 on the back side of the alley between the sensing areas 20, simultaneously. The unetched portion of the substrate 10 makes the rim 30. Thereafter, the infrared absorbing film 16 made from a material such as gold black is deposited to finalize a fabrication of the infrared sensor S1. The infrared absorbing film 16 may be deposited by vacuum evaporation. In the case that a plurality of the infrared sensors S1 are fabricated on a single silicon wafer, the wafer is divided into each sensor S1 by means of a method such as dicing cut.

Figure 5:
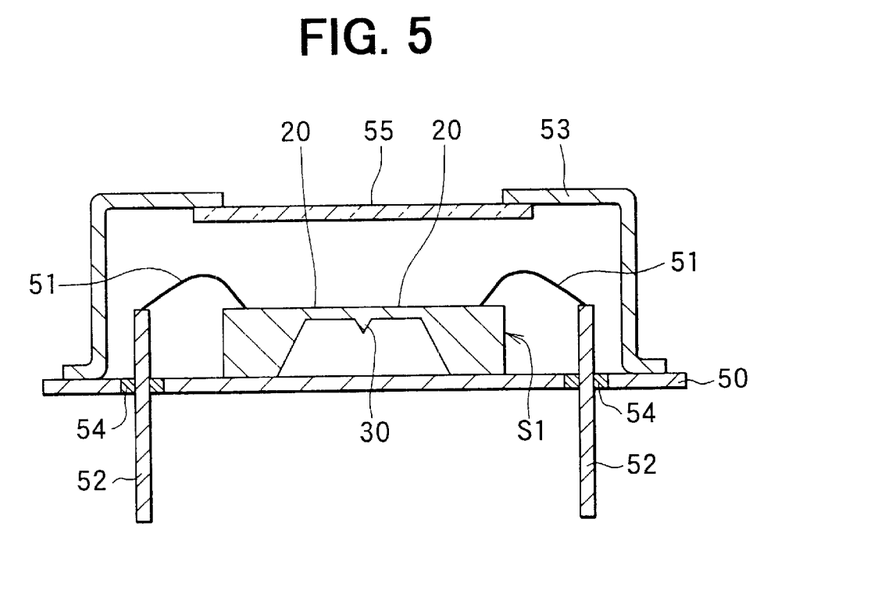
FIG. 5 is a cross-sectional view of an infrared sensor package using the first embodiment.

An infrared sensor package is shown in FIG. 5. The infrared sensor S1 is assembled on a stem 50 made of a metal (e.g., stainless steel) with an adhesive such as silver paste. A bonding wire 51 connects electrically the sensor S1 and a pin 52 made of a metal (e.g., stainless steel). A cap 53 and the stem 50 are welded and sealed together. The pin 52 is fixed and sealed at a though-hole of the stem 50 with a hermetic seal 54. The cap 53 has an optical filter 55 to let the sensor S1 expose to infrared. The packaged infrared sensor may be mounted in an air conditioning system to sense infrared emitted from an object at each sensing area 20. The thermocouple member 15 transduces heat generated at the infrared absorbing film 16 into an electric signal.

In this embodiment, a power is generated at a junction of the n-type polysilicon line 15a and the aluminum line 15b by heat generated at the infrared absorbing film 16. The power is picked up outward through the bonding wire 51 and the pin 52 and utilized as thermal information for e.g., an air conditioner. The thermopile structure formed by connecting tens of thermocouples consisting of the n-type polysilicon line 15a and the aluminum line 15b in series enables to enhance an electric output from the thermocouple member 15 to the degree of a few mV for instance.

The proposed rim is made from a Boron-doped-etch-stop layer that requires high concentration doping such as $10^{19}$ $cm^{-3}$ to $10^{20}$ $cm^{-3}$ or more that needs long time diffusion. A thin-film sensing area tends to deform due to a stress in the proposed rim caused by the high concentration doping and the rim tends to be weakened because crystal defects in the rim are generated during diffusion period. In contrast, in this embodiment, the rim 30 is an unetched portion of a substrate with a lower impurity concentration, $1 \times 10^{19}$ $cm^{-3}$ or less, in comparison with $10^{19}$ $cm^{-3}$ to $10^{20}$ $cm^{-3}$ or more of the proposed rim so that it is possible to form a rim with a lower stress and fewer crystal defects. Thus, this embodiment enables to provide the infrared sensor S1 (a semiconductor device) with a small deformation in the thin-film sensing area 20 and the robust rim 30 and to provide a method for fabricating the semiconductor device.

The rim 30 is the unetched portion of the substrate 10 having the (111)-oriented side slopes 30a and has a triangular shape in the perpendicular cross-section to a (100)-orientation. Thus, it is possible to make the weight of the rim 30 lighter without sacrificing strength other than that of the proposed rim with a rectangular cross-section made from the Boron-doped-etch-stop layer.

Second Embodiment

Figure 6:
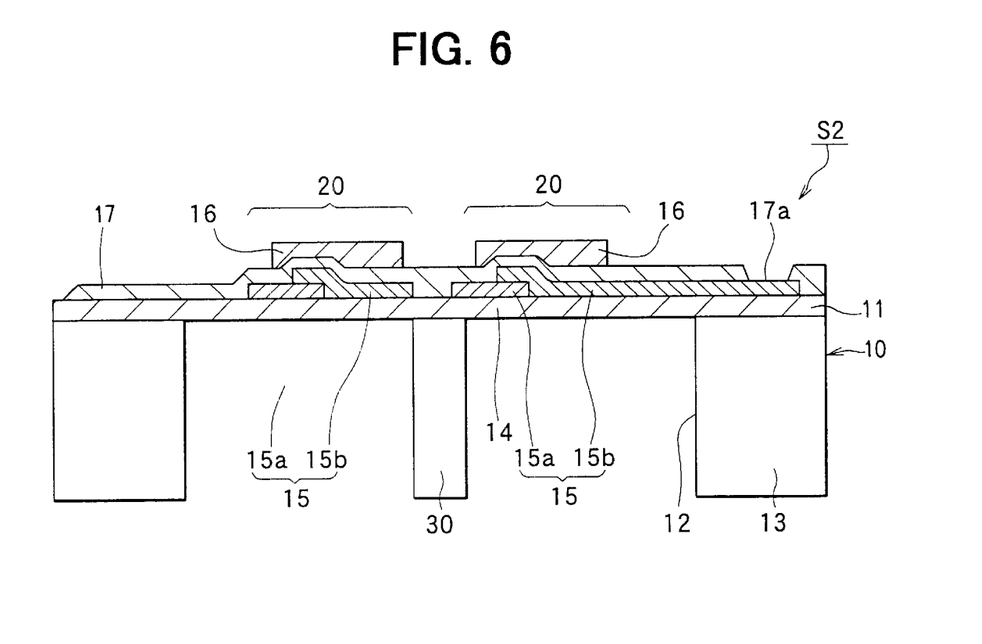
FIG. 6 is a cross-sectional view of an infrared sensor according to a second embodiment of the present invention.

An infrared sensor according to a second embodiment is shown in FIG. 6 and indicated with reference numeral S2. The infrared sensor S2 has the concave 12 and the rim 30 that have a rectangular cross-sectional structure. Hereafter, the terms, the top side and the bottom side, mean one side that includes the thin-film sensing area 20 and the other side that includes the concave 12 in FIG. 6, respectively. The rectangular cross-sectional structure made with a perpendicularly anisotropic etching is a major difference from the first embodiment. Hereafter, the difference is mainly described.

In the second embodiment, the rim 30 consists of an unetched portion of the substrate 10 with $1 \times 10^{19}$ $cm^{-3}$ or less of impurity concentration as well as in the first embodiment. In contrast to the first embodiment, the orientation of the silicon substrate 10 is not restricted to (100) in the second embodiment and the rim 30 has the same thickness as that of the substrate.

Figure 7:
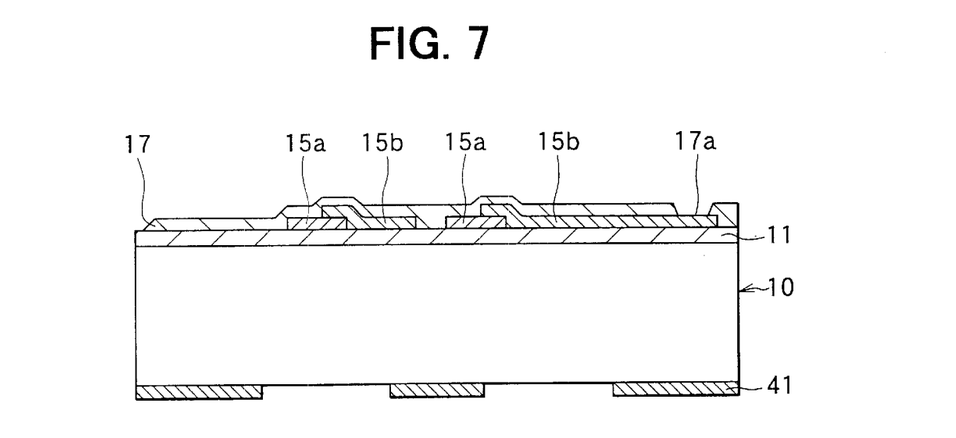
FIG. 7 is a cross-sectional view of a fabrication process of the second embodiment.

A fabrication method of the infrared sensor 2 is described as follows. As shown in FIG. 7, desired patterns of the film 11, the line 15a, the line 15b and the film 17 are defined one by one on the top side of the silicon substrate 10. As shown in FIG. 7, the surface on the bottom side of the substrate 10 is partially masked by the film 41 that is made of a material such as silicon oxide to provide both the unmasked section on the back side of a thin-film sensing area 20 and the masked section on the back side of an alley between the sensing areas 20 where the rim 30 is formed.

An perpendicularly anisotropic etching is applied to the surface on the bottom side of the silicon substrate 10. A preferable method of the perpendicularly anisotropic etching is Reactive-Ion-Etching that provides a precise etching utilizing reactive ions having directivity. Perpendicularly-anisotropic plasma etching may be used as well. The etching proceeds only to the top side from the bottom side in the substrate 10 so that the rim 30 has a rectangular cross section and the same thickness as that of the substrate 10. Thereafter, the infrared absorbing film 16 is deposited to finalize a fabrication of the infrared sensor S2. As shown in FIG. 5, packaging the infrared sensor S2 on the stem 50 enables temperature sensing.

In this embodiment, it is possible to form the rim 30 with a lower stress and fewer crystal defects than those of the proposed rim so that this embodiment enables to provide the infrared sensor S2 (a semiconductor device) with a small distortion in the thin-film sensing area 20 and the robust rim 30 and to provide a method for fabricating the semiconductor device.

Third Embodiment

Figure 8:
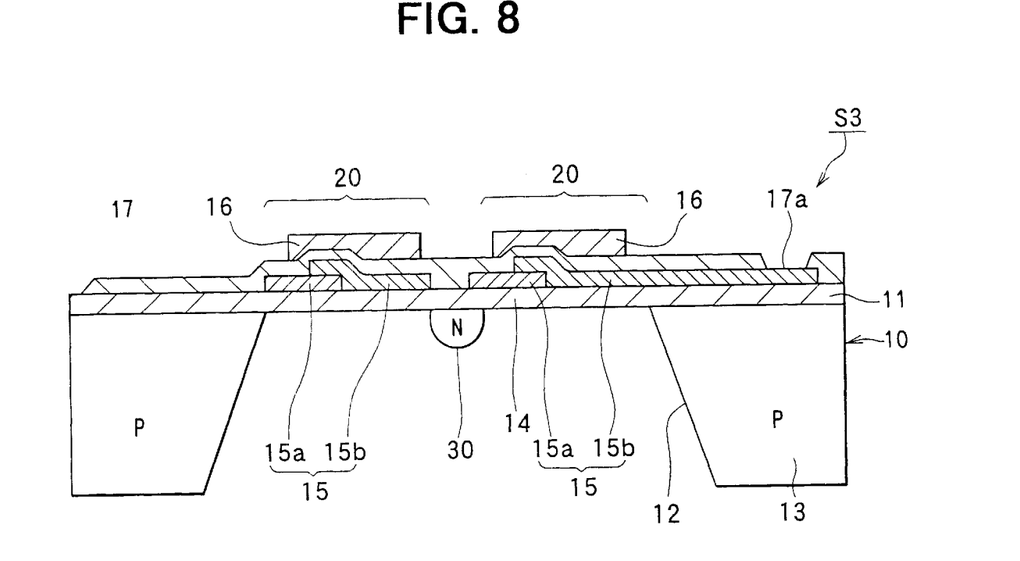
FIG. 8 is a cross-sectional view of an infrared sensor according to a third embodiment of the present invention.

An infrared sensor according to a third embodiment is shown in FIG. 8 and indicated with reference numeral S3. An electrochemical etching is applied for forming the rim 30 and for making the concave 12. The etching method is a major difference from the first embodiment. Hereafter, the difference is mainly described.

In the third embodiment, the rim 30 consists of an unetched portion of the silicon substrate 10 (semiconductor substrate). A p-type silicon substrate 10 doped with an impurity such as Boron is utilized. The rim 30 is made from an n-type region having $1 \times 10^{19}$ cm$^{-3}$ or less of impurity concentration. The n-type region is created by doping an impurity such as Phosphorus into the substrate 10. In contrast to the first embodiment, the orientation of the silicon substrate 10 is not restricted to (100) in the third embodiment.

Figure 9:
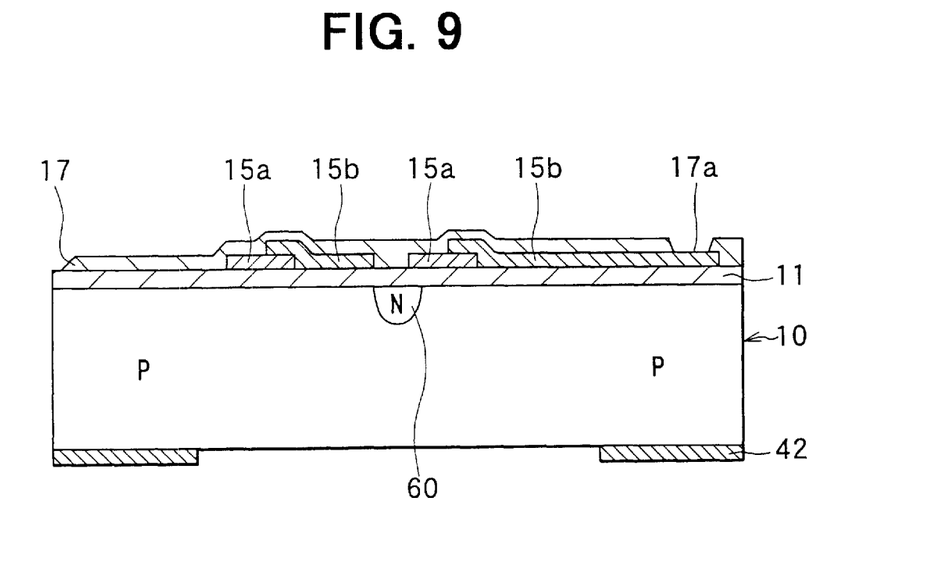
FIG. 9 is a cross-sectional view of a fabrication process of the third embodiment.
Figure 10:
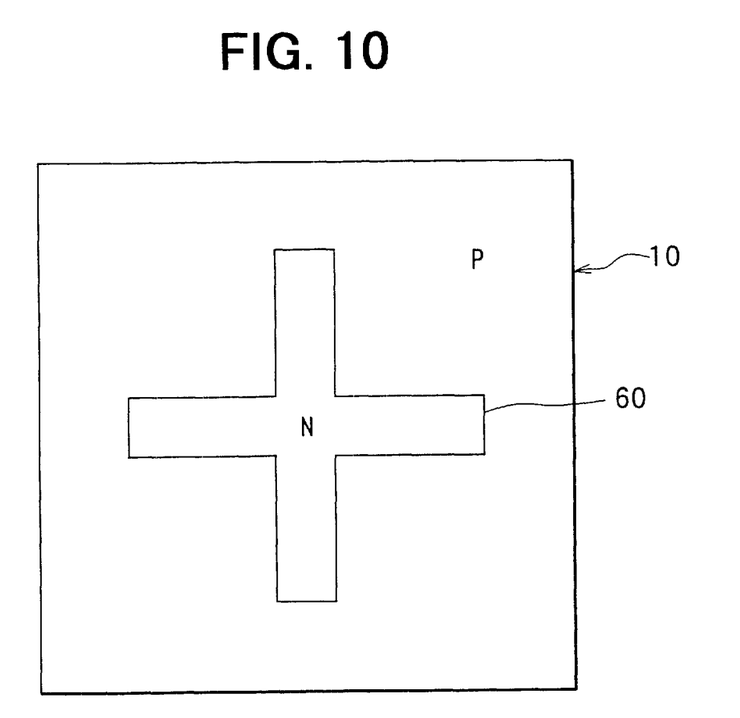
FIG. 10 is a plan view of an n-type diffusion area of the third embodiment.

A fabrication method of the infrared sensor S3 is described as follows. Hereafter, the terms, the top side and the bottom side, mean one side that includes the thin-film sensing area 20 and the other side that includes the concave 12 in FIG. 8, respectively. An n-type impurity such as Phosphorus is doped in a region under the alley between the sensing areas 20 on the top side of the p-type silicon substrate 10 that is doped with an impurity such as Boron. The n-type impurity concentration is $1 \times 10^{19}$ cm$^{-3}$ or less (e.g., $10^{15}$ to $10^{16}$ cm$^{-3}$). An n-type region 60 is formed in a cross shape as shown in FIG. 10 that is a plan view taken from the top side of the substrate 10. Thereafter, desired patterns of the film 11, the line 15a, the line 15b and the film 17 are defined one by one on the top side of the silicon substrate 10. As shown in FIG. 9, the surface on the bottom side of the substrate 10 is partially masked by the film 42 that is made of a material such as silicon nitride to provide an unmasked section where the concave 12 is made. Not shown in a figure, the n-type region 60 has an electric contact via a contact hole with a line that is formed for an electrochemical etching.

An anisotropic etching with an etchant such as KOH is applied to the surface on the bottom side of the semiconductor substrate 10 with a voltage applied to the n-type region 60. A p-type region of the substrate 10 is selectively etched while the n-type region 60 is unetched so that the n-type region 60 that is left unetched makes the rim 30. Thereafter, the infrared absorbing film 16 is deposited to finalize a fabrication of the infrared sensor 3 shown in FIG. 8. As shown in FIG. 5, packaging the infrared sensor 3 on the stem 50 enables temperature sensing.

In this embodiment, the n-type region 60 is etch-proof irrespective of impurity concentration (n-type impurity concentration) because the region 60 works electrochemically as an etch stopper. Therefore, the rim 30 with a lower impurity concentration than that of the proposed rim is provided so that it is possible to form the rim 30 with a lower stress and fewer crystal defects. Thus, this embodiment enables to provide the infrared sensor 3 (a semiconductor device) with a small distortion in the thin-film sensing area 20 and the robust rim 30 and to provide a method for fabricating the semiconductor device.

In this embodiment, the rim 30 and the periphery 13 that are made from n-type semiconductor and p-type semiconductor, respectively, are processed with good etching selectivity. Thus, this embodiment enables to provide a precisely-processed semiconductor device.

A Modification of the Third Embodiment

Figure 11:
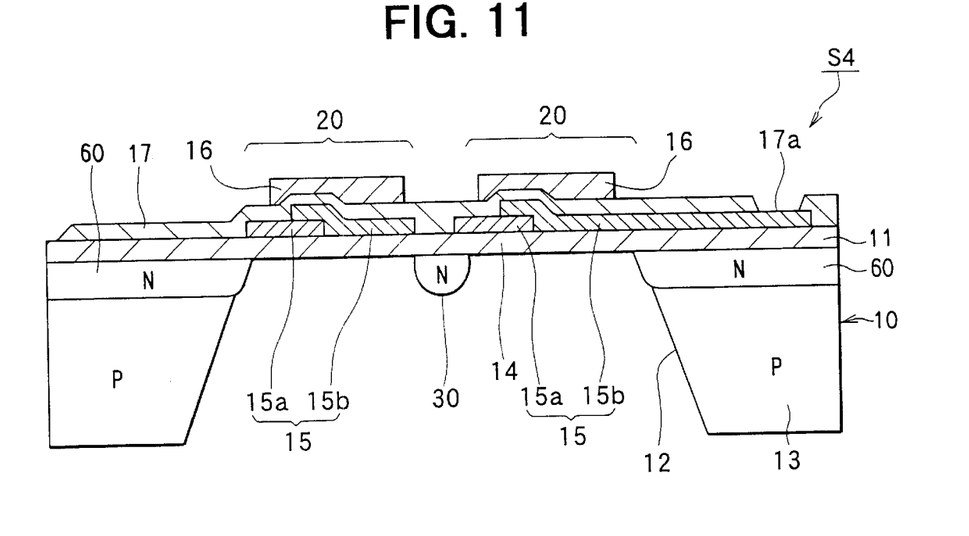
FIG. 11 is a cross-sectional view showing a modification of the third embodiment.
Figure 12:
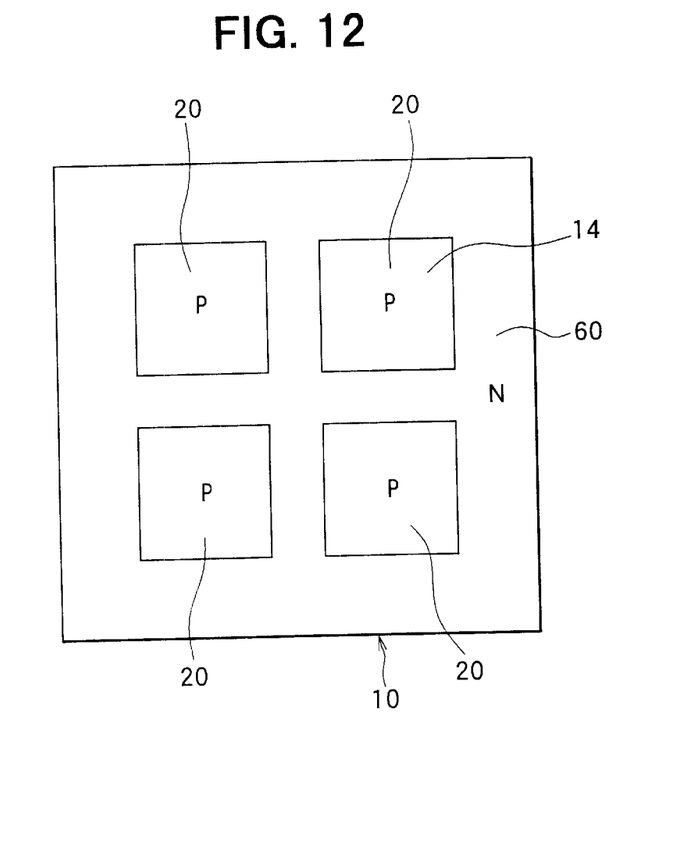
FIG. 12 is a plan view showing an n-type diffusion area of the modification of the third embodiment.

An infrared sensor according to a modification of a third embodiment is shown in FIG. 11 and indicated with reference numeral S4. Hereafter, the terms, the top side and the bottom side, mean one side that includes the thin-film sensing area 20 and the other side that includes the concave 12 in FIG. 11, respectively. In this embodiment, an n-type region is formed on the top side in a surface region of the periphery 13 in addition to the rim 30. The periphery 13 and the rim 30 have almost same doping depth. As shown in FIG. 12 that is a plan view taken from the top side of the substrate 10, the n-type region 60 is formed on all the area except the thin-film sensing area 20.

A fabrication method of the infrared sensor S4 is described as follows. An impurity such as Phosphorus is doped by means of a method such as ion implantation into all the area except the thin-film sensing area 20 on the top side of the p-type silicon substrate 10 having an impurity such as Boron. The n-type region 60 with $1 \times 10^{19}$ cm$^{-3}$ or less (e.g., $10^{15}$ to $10^{16}$ cm$^{-3}$) of n-type impurity concentration is formed as shown in FIGS. 11 and 12. Thereafter, desired patterns of the film 11, the line 15a, the line 15b, the film 17 and the mask 42 are defined one by one on the silicon substrate 10 with the same process that is used for the fabrication of the infrared sensor 3 shown in FIG. 8.

An anisotropic etching with an etchant such as KOH is applied to the surface on the bottom side of the semiconductor substrate 10 with a voltage applied to the n-type region 60. Thereafter, the infrared absorbing film 16 is deposited to finalize a fabrication of the infrared sensor 4.

In this embodiment, the n-type region 60 that is etch-proof and works electrochemically as an etch stopper is formed on the top side in a surface region of the periphery 13 as well as in a region under the alley between the sensing areas 20. The size and the arrangement of the thin film area 14 are defined by the patterning precision of the n-type region 60 so that it is possible to control precisely the size and the arrangement of the thin film 14. Thus, this embodiment enables to provide a more precisely-processed semiconductor device.

Another Embodiment

The concave 12 and the rim 30 may be formed by a combination of the perpendicularly anisotropic etching in the second embodiment and the anisotropic etching in the first embodiment. In this embodiment, a certain depth of the (100)-oriented substrate 10 that is partially masked is etched by a perpendicularly anisotropic etching using such as Reactive-Ion-Etching. Thereafter an anisotropic etching using an etchant such as KOH is applied to the substrate to complete an etching process. The rim 30 in almost same shape as in the first embodiment is formed.

The thin film 11 is made of a film such as silicon nitride or silicon oxide and functions as an etch stop. Silicon nitride for an anisotropic etching using KOH and silicon oxide for an etching using Reactive-Ion-Etching are preferable and, respectively, from the standpoint of etching rate of the film 11.

In all the embodiments mentioned above, the thermocouple member 15 consisting of the n-type polysilicon line 15a and the aluminum line 15b is used as a transducer that transduces heat generated by an infrared exposure to the film 16 into an electric signal. However, the thermocouple member 15 may be composed of other two conductor or semiconductor materials that have a different Seebeck coefficient from each other.

A bolometer that senses temperature by measuring electric resistance and a pyroelectric devise that senses temperature by measuring dielectric constant may be utilized as another transducer as well as a thermopile that is formed by connecting a plurality of thermocouples in series.

The present invention may be applied to other semiconductor devices such as a flow rate sensor that includes a thin-film sensing area.

What is claimed is:

1. A method for fabricating a semiconductor device from a (100)-oriented semiconductor substrate having a plurality of sensing areas disposed on a first surface of the semiconductor substrate, the method comprising:

partially masking a second surface of the semiconductor substrate opposite to the first surface to thereby provide an unmasked section under the plurality of sensing areas for defining a concave etch region, and to thereby provide masked sections on a periphery of the concave etch region and on an opposite side of an alley between the plurality of sensing areas; and applying an anisotropic etch to the concave etch region to thereby provide the concave region and an unetched portion on a bottom of the concave region.

2. The method as in claim 1, wherein the partially masking of the second surface further comprises:

providing the masked section on the opposite side of the alley to be wider than the unetched portion resulting from the applying of the anisotropic etch.

3. The method as in claim 1, the method further comprising:

covering the plurality of sensing areas with an infrared absorbing film.

4. The method as in claim 3, wherein:

the plurality of sensing areas include a transducer that transduces heat generated by an infrared exposure into an electric signal; and the transducer is a thermopile, a bolometer or a pyroelectric device.

5. A method for fabricating a semiconductor device from a (100)-oriented semiconductor substrate having a plurality of sensing areas disposed on a first surface of the semiconductor substrate, the method comprising:

partially masking a second surface of the semiconductor substrate of the semiconductor substrate opposite to the first surface to thereby provide an unmasked section under the plurality of sensing areas for defining a concave etch region, and to thereby provide masked sections on a periphery of the concave etch region and on an opposite side of an alley between the plurality of sensing areas; and applying a perpendicularly anisotropic etching to the concave etch region to provide the concave region and an unetched portion of the semiconductor substrate.

6. The method as in claim 5, wherein the applying of the perpendicularly anisotropic etching further comprises utilizing a reactive ion etch as the perpendicularly anisotropic etching.

7. A method to fabricate a semiconductor device made from a semiconductor substrate having a p-type conductivity, the semiconductor device including a concave region formed on a first surface of the semiconductor substrate and a plurality of sensing areas formed on a second surface opposite to the concave region, the method comprising;

doping an n-type impurity in a region under an alley between a plurality of sensing areas for thereby providing an n-type region;

masking the first surface on a periphery of a concave etch region; and applying an anisotropic etching to the concave etch region while a voltage is applied to the n-type region to provide the concave region and an unetched portion of the semiconductor substrate on a bottom of the concave region.

8. The method as in claim 7, the method further comprising:

doping the n-type impurity in another region under the second surface with the exception of a portion under the plurality of sensing areas.

9. The method as in claim 7, wherein the doping of the n-type impurity in the region under the alley further comprises doping the n-type impurity with a concentration of approximately $1 \times 10^{19}$ cm$^{-3}$ or less within the region under the alley.

10. The method as in claim 7, wherein the doping of the n-type impurity in the region under the alley further comprises doping the region in a cross-shaped manner for defining a rim.

11. The method as in claim 7, wherein the masking of the first surface further comprises leaving an unmasked portion on a bottom side of the semiconductor substrate corresponding to the plurality of sensing areas.

12. The method as in claim 7, wherein the applying of the anisotropic etching further comprises selectively etching a p-type region for forming a periphery portion while the region where the n-type impurity is doped remains substantially unetched for forming the rim.

13. The method as in claim 5, further comprising providing the semiconductor substrate to have an impurity concentration of $1 \times 10^{19}$ cm$^{-3}$ or less.

14. The method as in claim 1, further comprising providing the (100) oriented semiconductor substrate to have an impurity concentration of $1 \times 10^{19}$ cm$^{-3}$ or less.

* * * * *

UNITED STATES PATENT AND TRADEMARK OFFICE
CERTIFICATE OF CORRECTION

PATENT NO. : 6,579,740 B2
DATED : June 17, 2003
INVENTOR(S) : Inao Toyoda It is certified that error appears in the above-identified patent and that said Letters Patent is hereby corrected as shown below:

<u>Title page,</u>
Item [54], correct the title of the invention "METHOD OF MAKING A THIN FILM SENSOR" to be -- SEMICONDUCTOR DEVICE WITH A THIN-FILM SENSING AREA AND DEVICE FABRICATION METHOD --

Signed and Sealed this

Twenty-third Day of September, 2003

JAMES E. ROGAN
*Director of the United States Patent and Trademark Office*